DIODE MODULATOR WITH DISTORTION-REDUCING CIRCUIT

Filed Aug. 5, 1960 2 Sheets-Sheet 1

INVENTORS.
ROBERT R. DARDEN, Jr.
ALEX G. DOBBS
BY
Raymond A. Paquin
ATTORNEY

DIODE MODULATOR WITH DISTORTION-REDUCING CIRCUIT

Filed Aug. 5, 1960 2 Sheets-Sheet 2

INVENTORS.
ROBERT R. DARDEN, Jr.
ALEX G. DOBBS.
BY
Raymond A. Paquin
ATTORNEY.

3,196,369

DIODE MODULATOR WITH DISTORTION-REDUCING CIRCUIT

Robert R. Darden, Jr., Massapequa, and Alex G. Dobbs, Huntington Station, N.Y., assignors to American Bosch Arma Corporation, a corporation of New York Filed Aug. 5, 1960, Ser. No. 47,690
13 Claims. (Cl. 332—43)

The present invention relates to signal modulating devices and has particular reference to modulators employing diodes as non-linear elements.

Modulation is widely used for many purposes, one of which is the production of electrical signals whose frequency is a measure of some quantity. In such instances the electrical signal may be obtained by mixing a pair of signals in a modulator which gives an output signal including components of the sum and difference frequency as well as other components, from which the desired difference signal can be separated by filtering.

Present day devices for this purpose are numerous and varied in construction. Those using diodes for non-linear elements are particularly advantageous from the standpoint of simplicity, ruggedness and economy, but they suffer from an inherent fault whereby the output has a high percent of distortion. The presence of distortion can be traced to the characteristics of the diode which do not follow the square-law curve.

The theory of modulation is well established and it is known that if signals of two frequencies are applied to a non-linear resistance whose characteristic is a parabola, a square-law curve, the current in the circuit contains components having frequencies equal to the fundamental, the second harmonic and the sum and difference of the two input signal frequencies. A balanced modulator removes certain of these frequencies and the output contains only the sum and difference of the two input signal frequencies. The output of modulators using elements which are not square law devices, such as diodes contain higher order harmonics and the sums and differences thereof. Since some of these higher order differences may result in frequencies comparable to the sum or difference of the fundamental frequencies some distortion may result. The present invention seeks to modify the characteristic of a diode to more nearly approach that of a parabola and to thereby reduce the distortion in the output.

In particular each diode of a modulator is shunted by a uni-directional voltage source and a diode in series therewith to modify the characteristic of the modulator diode so as to approach a parabola.

In one embodiment the diode shunting circuit includes a battery for supplying the unidirectional voltage. This circuit performs extremely well in reducing distortion but is not universally applicable due to the fact that the ratio between the amplitude of either of the signal voltages and the battery voltage may be not constant.

For more universal application, therefore, the unidirectional voltage is preferably provided by rectification and filtering of at least one of the input signal voltages.

For a more complete understanding of the invention, reference may be had to the accompanying diagrams, in which.

Figure 1:
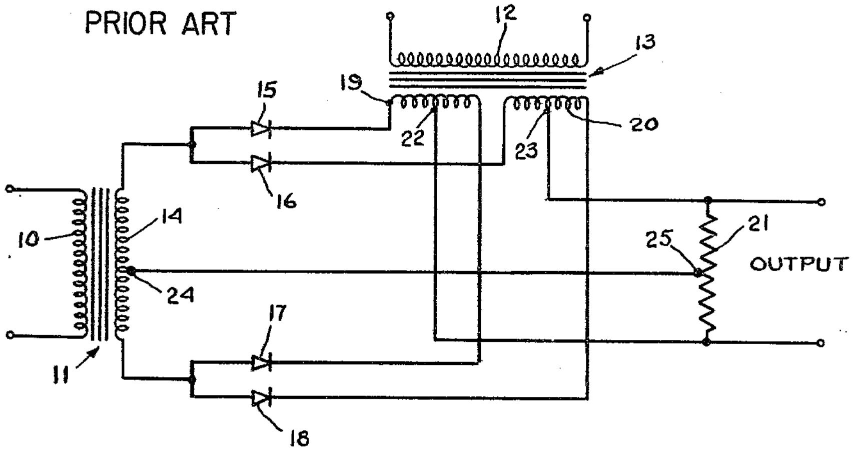
FIG. 1 is a prior art balanced modulator.

FIG. 1 shows a known full wave balanced modulator the imperfections of which are substantially reduced by the present invention. Reviewing the circuit of FIG. 1, one signal, e.g. the carrier, is applied across the primary winding 10 of transformer 11, the other signal, i.e. the modulation signal, is applied across the primary winding 12 of transformer 13. The single secondary winding 14 of transformer 11 is connected through diodes 15, 17 to one secondary winding 19 of transformer 13 and is also connected through diodes 16 and 18 to the other secondary winding 20 of transformer 13. Load resistor 21 is connected across the center taps 22, 23 on windings 19, 20 respectively while the center tap 24 on winding 14 is connected to the midpoint 25 of resistor 21. It will be understood that in this prior-art circuit, as well as in the embodiments of the invention described in detail hereinafter, the two secondary windings 19 and 20 are wound so that signals induced therein by primary winding 12 are oppositely phased in the two secondary windings.

In the ideal balanced modulator the carrier and modulating signals are eliminated from the output, so that the output signal contains only frequencies equal to the sum and difference frequencies of the carrier and modulating signal. This is accomplished in square-law devices as described in literature dealing with the theory of modulation, but since the diodes 15–18 of FIG. 1 are not square-law devices some distortion, represented by existence of undesired signals, will result.

Figure 2:
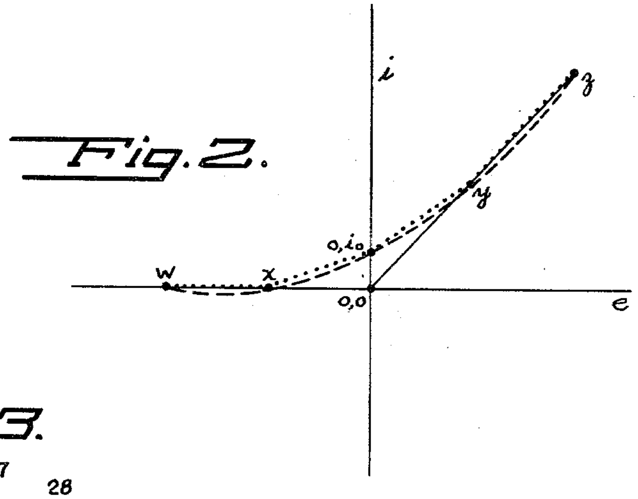
FIG. 2 is an explanatory diagram.

FIG. 2 illustrates the characteristic of a diode (the solid curve) as being composed of two intersecting straight lines in which voltage $e$, across the diode is plotted on the abscissa and the current $i$, through the diode is plotted on the ordinate. Consider the four points $w$, $x$, $y$, $z$ on the solid curve whose coordinates can be expressed as $(-2E, o)$ $(-E, o)$ $(E, I)$ and $(2E, 2I)$ respectively. A square-law curve of parabola can be fitted on the diode characteristic through points $w$, $x$, $y$, $z$, as shown by the dashed curve. The difference between the dashed curve and the solid curve is characterized mainly by a current $i_0$ when $e=0$ on the dashed curve while $i_0=0$ when $e=0$ on the solid curve. A close approximation to the parabolic curve can be made by four straight lines which join $w$ and $x$, $x$ and $(o, i_0)$, $(o, i_0)$ and $y$, and $y$ and $z$ which are illustrated by the dotted lines. Since the distances along the abscissa between points $w$, $x$, $(o, o)$, $y$ and $z$ are equal it can be shown mathematically that $i_0$ is equal to one-sixth the current, 2I, at $z$. The present invention is a simple and effective means by which the solid curve characteristic of a diode is modified by the addition of a unidirectional current source so as to obtain the dotted curve characteristic which approximates the theoretically desirable square law relationship of the dashed curve.

Figure 3:
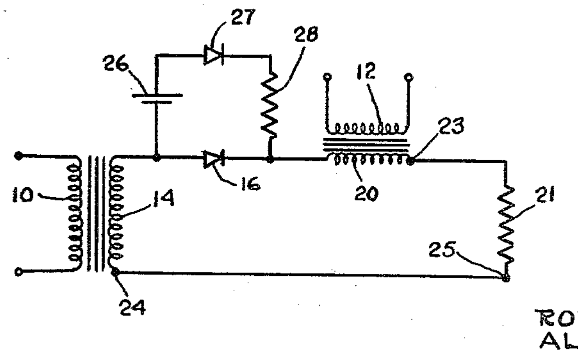
FIG. 3 shows one form of the invention applied to one part of FIG. 1.

For ease of explanation of the invention, a portion of the circuit of FIG. 1 is reproduced in FIG. 3 and includes one half of each of transformer windings 14 and 20, diode 16 and the upper half of resistor 21.

One method of shaping the characteristic of diode 16 to that shown by the dotted curve of FIG. 2 is shown in FIG. 3 wherein a battery 26, diode 27 and resistor 28 are connected across diode 16 with the polarity of the battery and diode 27 such that current will flow through diode 27 in the absence of signals on windings 14, 20. Resistor 28 is selected so that the current through resistor 21 is substantially equal to one-sixth of the maximum current expected when appropriate signals are induced in the windings 14 and 20.

When the voltage of the signals is such that the voltage across diode 16 is a large negative value, diode 27 is also cut off and the characteristic of the parallel circuit including diodes 16, 27 follows the line $wx$ on FIG. 2 as $e$ increases to $x$. As the signal increases to zero, the battery 26 becomes effective and the characteristic follows the line $x$ $(o, i_o)$. When the signal increases still further in the positive direction, diode 16 is in its low impedance state and the sum of the currents provided through diodes 16 and 27 follows the line $(o, i_o)$ $y$. At higher signals the diode 16 effectively short circuits the diode 27 circuit and the characteristic follows the line $y$, $z$.

It will be seen however, that the battery is a constant voltage device and will provide compensation only for signal voltages of a particular preselected magnitude, i.e. when $i_z$ is equal to six times $i_o$. For more universal application, the value of $i_o$ should be changed with the maximum voltage $e$. This may be accomplished by providing a D.C. supply through rectification of a part of the signal to transformer 11. Thus, referring to FIG. 4 the primary winding 31 of transformer 30 is connected across primary winding 10, while the secondary winding 32 of transformer 30 is connected to the series circuit including diode 33 and capacitor 34. The voltage across capacitor 34 is a unidirectional voltage of substantially constant magnitude where the magnitude is proportional to the signal voltage at transformer 11, and the circuit of FIG. 4 operates essentially similarly to the circuit of FIG. 3. The effect of transformer 30 can be obtained by adding some turns to winding 14 if desired. Also, some improvement may be found by adding a resistor in series with the diode 33 and capacitor 34.

Figure 4:
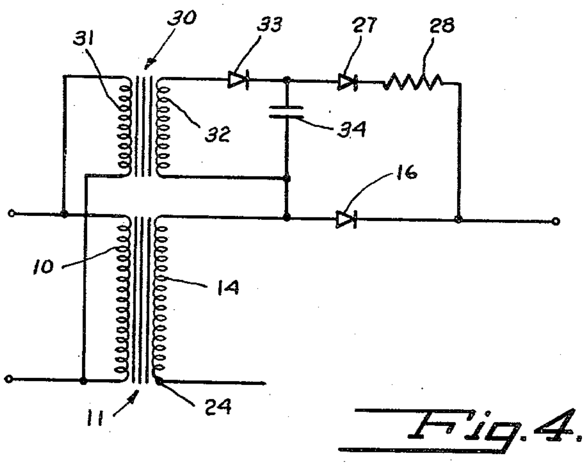
FIG. 4 shows another embodiment of the invention applied to the same part of FIG. 1.
Figure 5:
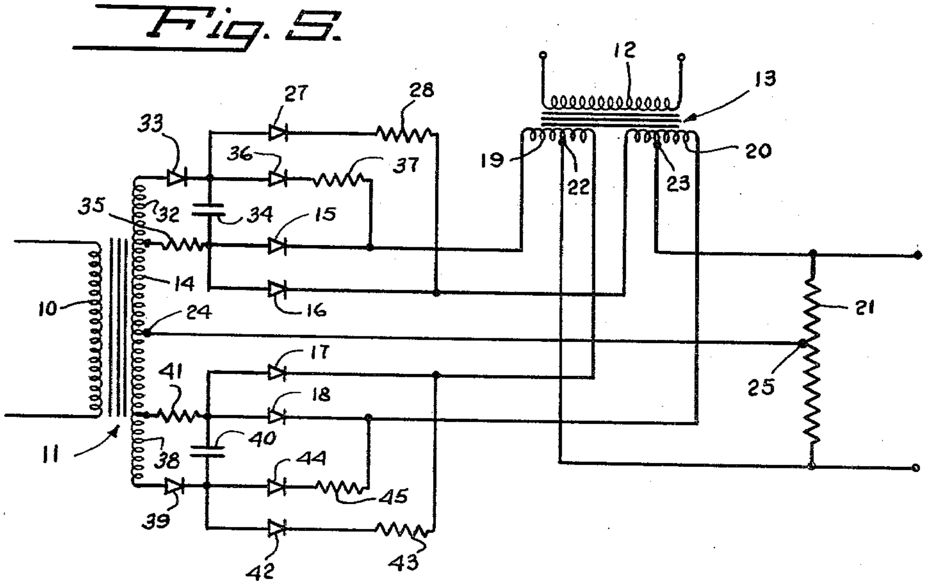
FIG. 5 shows a balanced modulator using the embodiment of FIG. 4 in a slightly different fashion.

FIGURE 5 shows the complete improved balanced modulator using the suggested improvements to the circuit of FIG. 4. Thus, it will be seen that while winding 32 is now a part of transformer 11 and a resistor 35 has been added to the series circuit of diode 33 and capacitor 34 connected across winding 32, the diode 16 is shunted by the circuit including capacitor 34, diode 27 and resistor 28 as in FIG. 4.

In similar fashion diode 15 is shunted by the series circuit including capacitor 34, diode 36 and resistor 37. A winding 38 similar to winding 32 is added to the lower half of transformer secondary winding 14 and diode 39, capacitor 40 and resistor 41 are connected in series across the added winding 38. As with diodes 15, 16, diode 17 is shunted by the series connected capacitor 40, diode 42 and resistor 43 while diode 18 is shunted by the series connected capacitor 40, diode 44 and resistor 45.

In experimental testing of the circuit of FIG. 5 it was found that the maximum frequency distortion of 14.5% present in the circuit of FIG. 1 could be reduced to 3% using the circuit of FIG. 5. Further reduction of distortion was noticed when using the battery arrangement described in relation to FIG. 3 although its use is restricted to special applications.

FIG. 2 moreover represents the transfer function of the modulator where the magnitude of the sum of the voltages being modulated can be measured on the abscissa to find the output current on the ordinate. It was stated before that $i_o$ is equal to $\frac{1}{6}$ $i_z$ but point $z$ was not defined with respect to physical quantities. It can be assumed, however, that the abscissa of point $z$ is equal to the peak value of $(E_1 \sin w_1t + E_2 \sin w_2t)$ where $E_1$ and $E_2$ are the amplitudes of the input signals while $w_1$ and $w_2$ are the angular frequencies of the input signals.

We claim:

1. In a device of the character described, a first source of first alternating voltage signals, a second source of second alternating voltage signals, a load, electrical connections for connecting said first and second sources in series with said load, a first non-linear impedance interposed in said electrical connections and supplied with said first and second signals, a source of unidirectional voltage having a substantially constant value over many cycles of said first signals, a second non-linear impedance, means for connecting said last named source and said second non-linear impedance in series D.C. circuit with each other, and means for connecting said series circuit across said first non-linear impedance and in common series circuit with said first and second sources.

2. In a device of the character described, a first source of first alternating voltage signals, a second source of second alternating voltage signals, a load, electrical connections for connecting said first and second sources in series with said load, a first diode interposed in said electrical connections and supplied with said first and second signals, a source of unidirectional voltage having a substantially constant value over many cycles of said first signals, a second diode, means for connecting said last named source and said second diode in series circuit with each other, and means for connecting said series circuit across said first diode and in common series circuit with said first and second sources.

3. In a device of the character described, a first source of first alternating voltage signals, a second source of second alternating voltage signals, a load, electrical connections for connecting said first and second sources in series with said load, a first non-linear impedance interposed in said electrical connections and supplied with said first and second signals, a source of unidirectional voltage having a substantially constant value over many cycles of said first signals, a second non-linear impedance, means for connecting said last named source and said second non-linear impedance in series D.C. circuit with each other, and means for connecting said series circuit across said first non-linear impedance and in common series circuit with said first and second sources, said unidirectional source of voltage comprising rectifying means connected to said first source and supplied with said first alternating voltage signals.

4. In a device of the character described, a first source of first alternating voltage signals, a second source of second alternating voltage signals, a load, electrical connections for connecting said first and second sources in series with said load, a first diode, interposed in said electrical connections and supplied with said first and second signals, a source of unidirectional voltage having a substantially constant value over many cycles of said first signals, a second diode, means for connecting said last named source and said second diode in series circuit with each other, and means for connecting said series circuit across said first diode and in common series circuit with said first and second sources, said unidirectional source of voltage comprising rectifying means connected to said first source and supplied with said first alternating voltage signals.

5. In a balanced modulator, a first source of alternating voltage signals, a second source of alternating voltage signals, a transformer having a primary winding energized by said first signal source and a secondary winding having a center tap, a second transformer having a primary winding energized by said second source and a pair of secondary windings each having center taps, an output impedance connected across said last named center taps, an intermediate point on said output impedance connected to said first named center tap, an intermediate tap on said first secondary winding, electrical connections between one end of each of said pair of secondary windings and said intermediate tap, first non-linear impedances interposed in each of said connections, a rectifier network including a rectifier, a capacitor and a resistor, connected between said intermediate tap and one end of said first secondary winding, and second non-linear impedances each connected in series with said capacitor in said rectifier circuit and in parallel with one of said first non-linear impedances.

6. In a balanced modulator, a first source of alternating voltage signals, a second source of alternating voltage signals, a transformer having a primary winding energized by said first signal source and a secondary winding having a center tap, a second transformer having a primary winding energized by said second source and a pair of secondary windings each having center taps, an output impedance connected across said last named center taps, an intermediate point on said output impedance connected to said first named center tap, an intermediate tap on said first secondary winding, electrical connections between one end of each of said pair of secondary windings and said intermediate tap, first diodes interposed in each of said connections, a rectifier network including a rectifier, a capacitor and a resistor, connected between said intermediate tap and one end of said first secondary winding, and second diodes each connected in series with said capacitor in said rectifier circuit and in parallel with one of said first diodes.

7. In a balanced modulator, a first source of alternating voltage signals, a second source of alternating voltage signals, a transformer having a primary winding energized by said first signal source and a secondary winding having a center tap, a second transformer having a primary winding energized by said second source and a pair of secondary windings each having center taps, an output impedance connected across said last named center taps, an intermediate point on said output impedance connected to said first named center tap, an intermediate tap on said first secondary winding, electrical connections between one end of each of said pair of secondary windings and said intermediate tap, first non-linear impedances interposed in each of said connections, a rectifier network including a rectifier, a capacitor and a resistor, connected between said intermediate tap and one end of said first secondary winding, second non-linear impedances each connected in series with said capacitor in said rectifier circuit and in parallel with one of said first non-linear impedances, a second intermediate tap on said first secondary winding, electrical connections between the other end of each of said pair of secondary windings and said second intermediate tap, third non-linear impedances interposed in each of said last named connections, a second rectifier network including a rectifier, capacitor and a resistor connected between said second intermediate tap and the other end of said first secondary winding, and fourth non-linear impedances each connected in series with said capacitor in said second rectifier network and in parallel with one of said third non-linear impedances.

8. In a balanced modulator, a first source of alternating voltage signals, a second source of alternating voltage signals, a transformer having a primary winding energized by said first signal source and a secondary winding having a center tap, a second transformer having a primary winding energized by said second source and a pair of secondary windings each having center taps, an output impedance connected across said last named center taps, an intermediate point on said output impedance connected to said first named center tap, an intermediate top on said first secondary winding, electrical connections between one end of each of said pair of secondary windings and said intermediate tap, first diode interposed in each of said connections, a rectifier network including a rectifier, a capacitor and a resistor, connected between said intermediate tap and one end of said first secondary winding, second diodes each connected in series with said capacitor in said rectifier circuit and in parallel with one of said first diodes, a second intermediate tap on said first secondary winding, electrical connections between the other end of each of said pair of secondary windings and said intermediate tap, third diodes interposed in each of said last named connections, a second rectifier network including a rectifier, capacitor and a resistor connected between said second intermediate tap and the other end of said first secondary winding, and fourth diodes each connected in series with said capacitor in said second rectifier network and in parallel with one of said third diodes.

9. In a balanced modulator, a first diode having an anode element and a cathode element and a current-voltage characteristic departing substantially from a square-law relationship; an impedance element in series circuit with said first diode; means for simultaneously producing two alternating signals of different frequencies in said circuit; a second diode having anode and cathode elements; electrical connections for connecting said anode elements of said first and second diodes together and said cathode elements of said first and second diodes together; and a source of constant voltage interposed in said last-named connections, said source producing a current through one of said diodes and through said impedance element when said two alternating signals are zero.

10. Apparatus in accordance with claim 9, in which said source is connected between corresponding elements of said first and second diodes.

11. Apparatus in accordance with claim 9, comprising a resistive element connected between corresponding elements of said first and second diodes.

12. Apparatus in accordance with claim 9, in which said source comprises rectifying means responsive to one of said two signals to produce a unidirectional voltage of substantially constant value but varying in accordance with changes in the amplitude of said one signal and means for applying said unidirectional voltage between corresponding elements of said first and second diodes.

13. Apparatus in accordance with claim 12, in which said rectifying means comprises capacitive means for connecting together said corresponding elements of said first and second diodes for signals of said different frequencies.

References Cited by the Examiner

UNITED STATES PATENTS

| | | | |
|---|---|---|---|
| 2,455,732 | 12/48 | Carter | 332—47 X |
| 2,724,742 | 11/55 | Chesnut | 332—44 |
| 2,820,949 | 1/58 | Hey | 332—47 |
| 2,922,960 | 1/60 | Stachiewicz | 329—154 X |
| 2,959,749 | 11/60 | Hannewald et al. | 332—37 |

ROY LAKE, *Primary Examiner.*

L. MILLER ANDRUS, ARTHUR GAUSS, *Examiners.*